US008271061B2

(12) United States Patent
Lallouet

(10) Patent No.: US 8,271,061 B2
(45) Date of Patent: Sep. 18, 2012

(54) CONNECTION ARRANGEMENT FOR TWO SUPERCONDUCTOR CABLES

(75) Inventor: Nicolas Lallouet, Paris (FR)

(73) Assignee: Nexans, Paris (FR)

( * ) Notice: Subject to any disclaimer, the term of this patent is extended or adjusted under 35 U.S.C. 154(b) by 635 days.

(21) Appl. No.: 12/420,214

(22) Filed: Apr. 8, 2009

(65) Prior Publication Data

US 2009/0264296 A1 Oct. 22, 2009

(30) Foreign Application Priority Data

Apr. 16, 2008 (FR) ..................................... 08 52541

(51) Int. Cl.
*H01L 39/02* (2006.01)
*H01R 4/68* (2006.01)
*H01B 12/00* (2006.01)

(52) U.S. Cl. ....... 505/220; 505/163; 505/926; 174/15.5; 174/15.4; 174/73.1

(58) Field of Classification Search .................. 505/220, 505/885, 886, 887, 925, 926; 174/125.1, 174/73.1, 88 R
See application file for complete search history.

(56) References Cited

U.S. PATENT DOCUMENTS

| | | | | |
|---|---|---|---|---|
| 7,067,739 | B2 * | 6/2006 | Ashibe et al. | 174/84 R |
| 7,332,671 | B2 * | 2/2008 | Mirebeau et al. | 174/15.5 |
| 2007/0284130 | A1 * | 12/2007 | Lallouet et al. | 174/84 S |

FOREIGN PATENT DOCUMENTS

| | | | |
|---|---|---|---|
| EP | 1804337 | | 7/2007 |
| EP | 1830445 | | 9/2007 |
| FR | 2878654 | * | 6/2006 |
| GB | 2331868 | * | 6/1999 |
| GB | 2350495 | | 11/2000 |

OTHER PUBLICATIONS

French Search Report dated Dec. 1, 2008.

* cited by examiner

*Primary Examiner* — Stanley Silverman
*Assistant Examiner* — Kallambella Vijayakumar
(74) *Attorney, Agent, or Firm* — Sofer & Haroun, LLP

(57) ABSTRACT

A connection arrangement for connecting together two superconductor cables, each having a central conductor comprising at least one superconductive part, a dielectric layer surrounding said central conductor, a shield surrounding said dielectric layer and a cryogenic enclosure surrounding said shield, the connection arrangement has an electrical splicing device for splicing together the central conductors and stripped dielectric layers of the corresponding shields. This connection arrangement has a covering made of semi-conductive material that is placed between the two shield ends and an electrical connection device for connecting together the two shield ends, the connection device surrounding the covering, being contained in the cryogenic enclosure, and comprising two junction elements each electrically and mechanically joined to a respective one of the shield ends, and an electrical splicing arrangement for splicing together the two junction elements.

7 Claims, 2 Drawing Sheets

CONNECTION ARRANGEMENT FOR TWO SUPERCONDUCTOR CABLES

RELATED APPLICATION

This application claims priority to French Patent Application No. 0852541, filed on Apr. 16, 2008, the entirety of which is incorporated by reference.

BACKGROUND OF THE INVENTION

1. Field of the Invention

The invention relates to a connection arrangement for two superconductor cables.

2. Discussion of Related Art

The transmission of electricity using high-voltage superconductor cables allows high currents to be transmitted through cables of much smaller section than standard cables made of resistive electrical conductors, while limiting electrical losses for the length of the cable, particularly Joule effect losses since this phenomenon is extremely low in superconductivity.

What is known as a "cold dielectric" superconductor cable is made up of a central superconductor comprising at least one superconductive part, a dielectric layer surrounding said central superconductor, a shield surrounding said dielectric layer and that may be made up in whole or in part of superconductors, and a cryogenic enclosure or "cryostat" surrounding said shield. Said cryostat generally comprises two concentric shells that are thermally insulated from each other, e.g. by a vacuum at a level of $10^{-5}$ millibars (mbar). A cryogenic fluid contained inside the internal shell of the cryostat cools the central conductor through the dielectric layer, hence the name "cold dielectric", until it reaches the temperature at which the conductor is in a state of superconductivity. By way of example, this temperature is of the order of −196° C. for what are known as "high-temperature" superconductors.

With cold dielectric superconductor cables, currents of similar magnitudes are lead to flow both in the central conductor and in the shield, in particular if the shield is made up in whole or in part of superconductors. For high-voltage cables, the magnitude of the current may be high, for example, 2400 amps (A).

This is also the case for what are known as "warm dielectric" superconductors, where the conductor comprises a hollow element, generally a tube, in which a cryogenic fluid circulates.

One solution for connecting together two such superconductor cables is to use an arrangement as described in document FR 2 878 654.

That document describes a connection arrangement for shields of superconductor cables, comprising a superconductive connecting cable between shields, the connecting cable comprising a connecting superconductor and a cryogenic sheath surrounding the connecting superconductor, each of the two ends of the connecting superconductor being joined to one of the shields by means of connections that are electrically and thermally conductive.

However, such an arrangement is particularly complex and costly, since it requires an additional entry and outlet for cryogenic fluid and a specific connecting superconductor.

OBJECT AND SUMMARY OF THE INVENTION

In order to solve those problems, the invention relates to an arrangement of two superconductor cables, in particular when connected together end to end, which arrangement is of a simple design and does not require an additional cryogenic fluid circuit.

In order to do this, the invention proposes a connection arrangement for connecting together two superconductor cables each comprising a central conductor comprising at least one superconductive part, a dielectric layer surrounding said central conductor, a shield surrounding said dielectric layer, and a cryogenic enclosure surrounding said shield, the connection arrangement comprising an electrical splicing device for splicing together said central conductors and said stripped dielectric layers of said corresponding shields, being characterized by its covering made of semi-conductive material that is placed between the two shield ends and an electrical connection device for connecting together the two shield ends, the connection device surrounding said covering being contained in said cryogenic enclosure, and comprising two junction elements, each electrically and mechanically joined to a respective one of said shield ends, and an electrical splicing arrangement for splicing together the two junction elements.

The semi-conductive covering confines the electric field in the dielectric layer, and the electrical connection device serves to convey the current carried by the shields.

In a preferred embodiment, said electrical splicing arrangement is constituted by a plurality of conducting braids connected at their ends to said junction elements and distributed around said semi-conductive covering Said braids may be made of copper.

This connection using braids is particularly easy to put in place due to the flexibility of the braids. It is also particularly inexpensive. It also accommodates thermal contraction-type deformation, due to the temperature of the cryogenic fluid.

Advantageously, each said junction element is formed by a tube, having its inside wall fastened to the outside wall of said shield.

Preferably, said tube is provided with an annular flange intended for fastening end terminals of said braids.

Each said junction element is advantageously fastened to the end of the corresponding shield by means of brazing or soldering using an alloy with a low melting temperature.

Said junction elements may be made of copper.

Said covering of semi-conductive material may be a winding of carbon black paper tape.

MORE DETAILED DESCRIPTION

Figure 1:
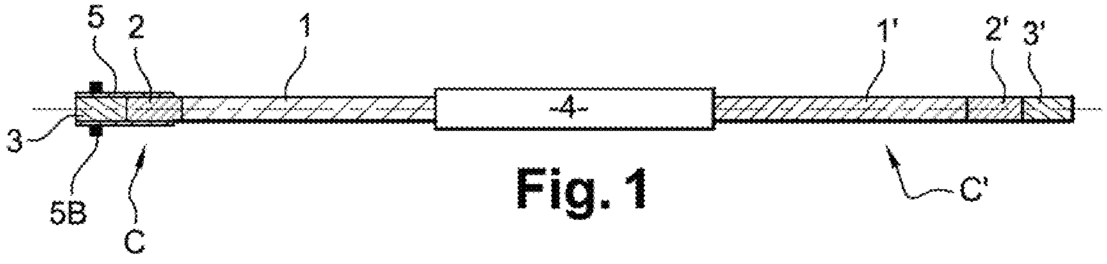
FIG. 1 is a longitudinal section view of two superconductor cables while being connected, in a first step.

As shown in FIG. 1, the end of each cold dielectric superconductor cable C, C' for connecting together end to end, firstly has its shield removed in order to reveal the dielectric layer 1, 1' that surrounds the central conductor of each cable. By way of example, this dielectric layer comprises several layers of polypropylene laminated paper (PPLP).

Here, the shield is formed by a layer of superconductive material 2, 2' and by a shield 3, 3' of metal, preferably copper, the metal shield being cut away so as to leave uncovered a short length of the layer of superconductive material 2, 2'.

The connection arrangement comprises, firstly, an electrical splicing device 4 for splicing together the central conductors and dielectric layers stripped of the corresponding shield. This splicing device is itself known and may be of the type described in patent EP 1 195 872.

Figure 4:
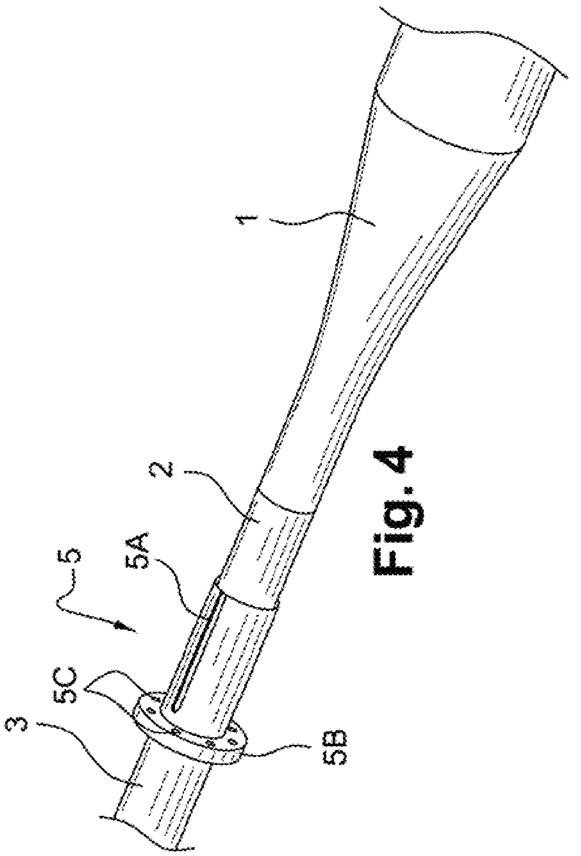
FIGS. 4 and 5 are detail views in perspective.

On the left cable C, a junction element 5 is joined electrically and mechanically to the end of the shield, in such a way as to cover the superconductive layer 2 and the metal shield 3 and to be joined thereto. This junction element 5 can be seen particularly in FIG. 4. It is formed by a tube, made of a material with good electrical conductivity, preferably copper, having its inside wall fastened to the outside wall of the shield, specifically, the layer of superconductive material 2 and the metal shield 3, this tube being placed so as to cover both of those parts.

To do this, the junction element 5 is attached by means of brazing or soldering using an alloy with a low melting temperature, introduced into a longitudinal slot 5A arranged in the tube. This alloy ensures that the layer of superconductive material 2 is not damaged.

The tube is equipped with an annular flange 5B for fastening of terminals, as described below, and in order to do this is equipped with orifices 5C that are regularly distributed angularly around the tube 5.

The connection arrangement in accordance with the invention comprises a covering of semi-conductive material placed between the two shield ends and an electrical connection device for connecting together the two shield ends, the device surrounding the covering and being contained within the cryogenic enclosure containing the cables C, C', as described below with reference to FIGS. 2 and 3.

Figure 2:
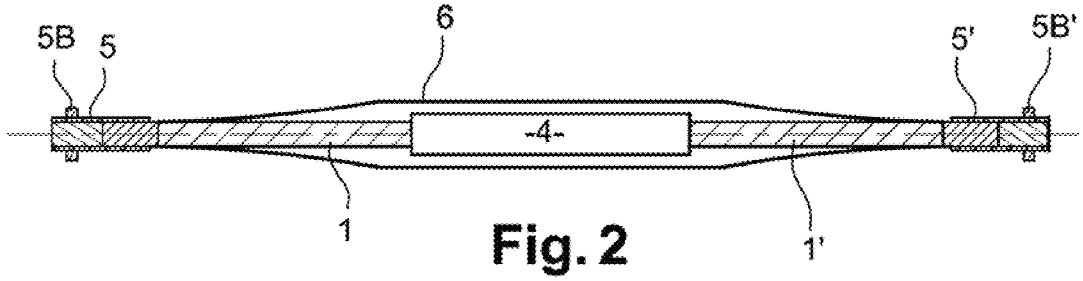
FIG. 2 is a longitudinal section view of two superconductor cables while being connected, in a second step.

As shown in FIG. 2, each shield end is provided with a respective junction element 5, 5' that is electrically and mechanically joined thereto as previously described above, and a covering of semi-conductive material 6 is placed between the two junction elements 5, 5', over the length of the connection, forming transition end cones between the different diameters, in the usual way. This covering of semi-conductive material 6 is preferably a winding of carbon black paper tape that may be reinforced with a fine copper mesh.

This semi-conductive covering 6 ensures the electric field is confined in the dielectric layer 1, 1'. At this stage in the making of the connection arrangement, the covering ensures that voltage is maintained, but cannot convey the current carried by the shields 2, 2', 3, 3'.

Figure 3:
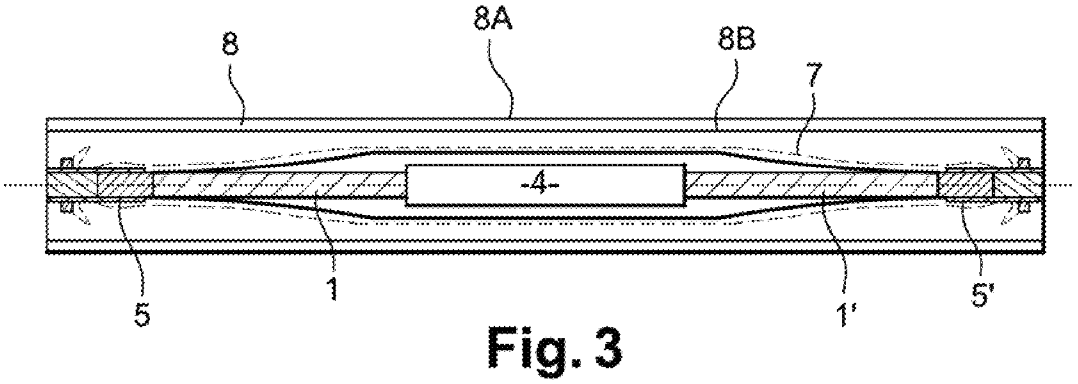
FIG. 3 is a longitudinal section view of a connection arrangement of two superconductor cables, in accordance with the invention.

Next, as shown in FIG. 3, an electrical splicing arrangement 7 for splicing together the two junction elements 5, 5' is put in place around the semi-conductive covering 6. This electrical splicing arrangement 7 can be seen particularly in FIG. 5 and is composed of a plurality of calibrated conductive braids 7A, made of a material with good electrical conductivity, preferably copper, the braids being connected at their ends to the junction elements 5, 5', and being distributed around the semi-conductive covering 6. The diameter of these braids 7A is calculated on the basis of the current to be carried, understanding that their resistance is low, since they are subsequently immersed in a cryogenic liquid.

Figure 5:
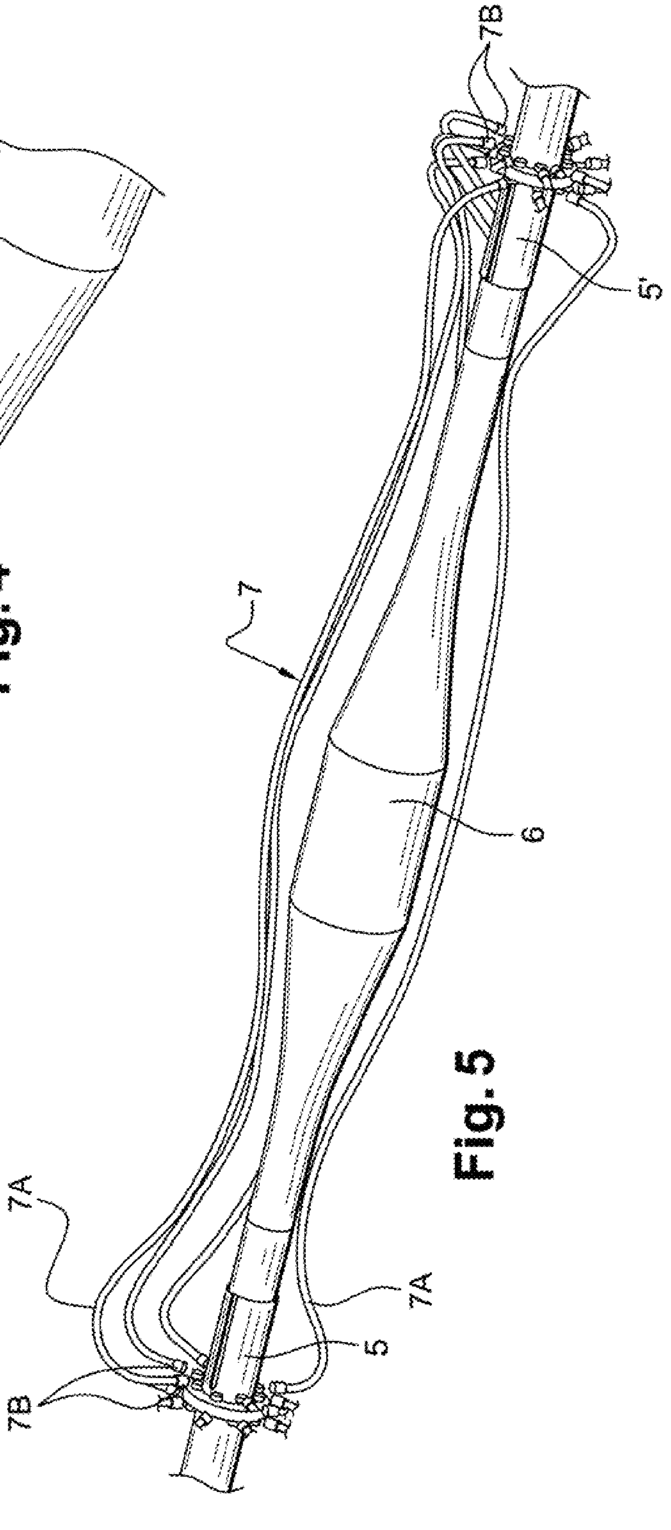

Not all of the braids 7A are shown in FIG. 5 in order to improve visibility, but in this embodiment there are eight of them, and they are provided at their ends with terminals 7B connected in the orifices 5C provided in the flange 5B of each junction element.

A cryogenic enclosure or cryostat 8 comprising an outer wall 3A and an inner wall 8B, surrounds the connection arrangement. A cryogenic fluid, e.g. liquid nitrogen, is able to circulate inside the inner wall 8B, in order to cool the superconductor cables C, C' and the connection. Thermal insulation is provided between the inside wall 8B and the outside wall 8A, e.g. a vacuum at a level of $10^{-5}$ mbar, in order to avoid heating and a high level of cryogenic fluid consumption.

The invention also applies to the connecting together of two warm dielectric superconductor cables, the difference being the construction of the conductors, which are tubular in this case.

What is claimed is:

1. A connection arrangement for connecting together two superconductor cables each having:

- a central conductor having at least one superconductive part;
- a dielectric layer surrounding said central conductor;
- a shield surrounding said dielectric layer; and
- a cryogenic enclosure surrounding said shield, the connection arrangement comprising:
- an electrical splicing device for splicing together said central conductors and said dielectric layers, stripped of said corresponding shields;
- a covering made of semi-conductive material that is placed between the two shield ends and an electrical connection device for connecting together the two shield ends, the connection device surrounding said covering, being contained in said cryogenic enclosure, and having two junction elements each electrically and mechanically joined to a respective one of said shield ends, and
- a plurality of conducting braids connected at their ends to said junction elements and distributed around said semi-conductive covering for splicing together the two junction elements.

2. A connection arrangement according to claim 1, wherein said braids are made of copper.

3. A connection arrangement according to claim 1, wherein each said electrical splicing device is formed by a tube having its inside wall fastened to the outside wall of said shield.

4. A connection arrangement according to claim 1, wherein each said electrical splicing device is formed by a tube having its inside wall fastened to the outside wall of said shield, and said tube is provided with an annular flange intended for fastening end terminals of said braids.

5. A connection arrangement according to claim 1, wherein each said electrical splicing device is fastened to the end of the corresponding shield by brazing or soldering using an alloy with alloy melting temperature.

6. A connection arrangement according to claim 1, wherein said junction elements are made of copper.

7. A connection arrangement according to claim 1, wherein said covering of semi-conductive material is a winding of carbon black paper tape.

* * * * *